US005872462A

United States Patent [19]

Ditlow et al.

[11] Patent Number: 5,872,462

[45] Date of Patent: Feb. 16, 1999

[54] PROGRAMMABLE LOGIC ARRAY AND METHOD FOR ITS DESIGN USING A THREE STEP APPROACH

[75] Inventors: Gary Stephen Ditlow, Garrison, N.Y.; Paul David Kartschoke, Williston, Vt.

[73] Assignee: International Business Machines Corporation, Armonk, N.Y.

[21] Appl. No.: 978,650

[22] Filed: Nov. 26, 1997

Related U.S. Application Data

[63] Continuation of Ser. No. 603,661, Feb. 20, 1996, abandoned.

[51] Int. Cl.[6] .......... H03K 19/177

[52] U.S. Cl. .......... 326/39; 326/41; 326/45; 364/490

[58] Field of Search .......... 326/39, 17, 44–45, 326/41–42, 48–50; 364/489–491; 340/825.83

[56] References Cited

U.S. PATENT DOCUMENTS

| | | | |
|---|---|---|---|
| 4,920,515 | 4/1990 | Obata | 326/39 |
| 4,990,801 | 2/1991 | Caesar et al. | 326/45 |
| 5,101,122 | 3/1992 | Shinonara | 326/44 |
| 5,471,155 | 11/1995 | Steele | 326/39 |
| 5,576,636 | 11/1996 | Baucom | 326/44 |

*Primary Examiner*—Jon Santamauro
*Attorney, Agent, or Firm*—Eugene I. Shkurko

[57] ABSTRACT

A PLA whose slowest product terms are located as close as possible to the true/complement generators or input buffers. The associated input buffers and product terms are partitioned into two or more sections. A modified gap cell recombines the product terms before propagating the signal into an array.

11 Claims, 3 Drawing Sheets

System: The PLA

PROGRAMMABLE LOGIC ARRAY AND METHOD FOR ITS DESIGN USING A THREE STEP APPROACH

This application is a continuation of application Ser. No. 08/603,661, filed Feb. 20, 1996, now abandoned.

CROSS-REFERENCES TO RELATED APPLICATIONS

U.S. patent application Ser. No. 08/603,662, entitled "PLA LATE SIGNAL CIRCUITRY USING A SPECIALIZED GAP CELL AND PLA LATE SIGNAL CIRCUITRY USING SWITCHED OUTPUT", filed concurrently herewith is assigned to the same assignee hereof and contains subject matter related, in certain respect, to the subject matter of the present application. The above-identified patent application is incorporated herein by reference.

BACKGROUND OF THE INVENTION

1. Technical Field of the Invention

This invention pertains to an improved hardware design for programmable logic arrays (PLAs). In particular, this invention tackles the problems associated with propagation delay of signals through a PLA, thereby providing enhanced performance of the PLA structure.

2. Background Art

The need for quick turn around time for generation of logic is well known. PLAs help tackle this need in that they can be easily automated in their creation. The propagation delay of signals through PLAs is a concern especially on high performance chips. One problem that can occur in PLAs with respect to its propagation delay is a particularly slow path or paths from the true/complement generator input or inputs through a product term or terms that increase the entire delay of the PLA. These slow paths can affect many of the PLA outputs, thereby producing significant signal propagation delay in many of the input-to-output transitions.

It is an object of the invention to reduce signal propagation delay through a PLA by redesigning pre-identified slow signal paths.

It is another object of the invention to provide a PLA with superior delay characteristics resulting from better placement of slow signal paths.

SUMMARY OF THE INVENTION

During a timing analysis of proposed PLA designs the slowest transitioning product terms inside of the PLA can be identified. These timing analyses are well known in the art and are not described further. Based on this information we describe here an invention that solves the slow product term problem (slowest path or paths) by taking a three step approach, any of which steps implemented individually also would improve the PLA performance. First, we physically relocate the offending (slow) product terms as close as possible to the input/output buffers, also known as the true/complement generators. Second, we duplicate the offending input buffers. Third, we split the product terms in question into two or more product terms and recombine them in a modified gap cell before propagating the signal into the OR array.

This invention solves the timing problem associated with propagation delays through PLAs. By attacking the problem with this unique three step approach which includes moving the offending product terms closer to the input/output buffers, duplicating the true/complement generators, then duplicating the heavily loaded product terms and recombining them within the modified gap cell, we can easily decrease the propagation delays through the PLA.

Other features and advantages of this invention will become apparent from the following detailed description of the presently preferred embodiment of the invention, taken in conjunction with the accompanying drawings.

BEST MODE FOR CARRYING OUT THE INVENTION

Figure 1:
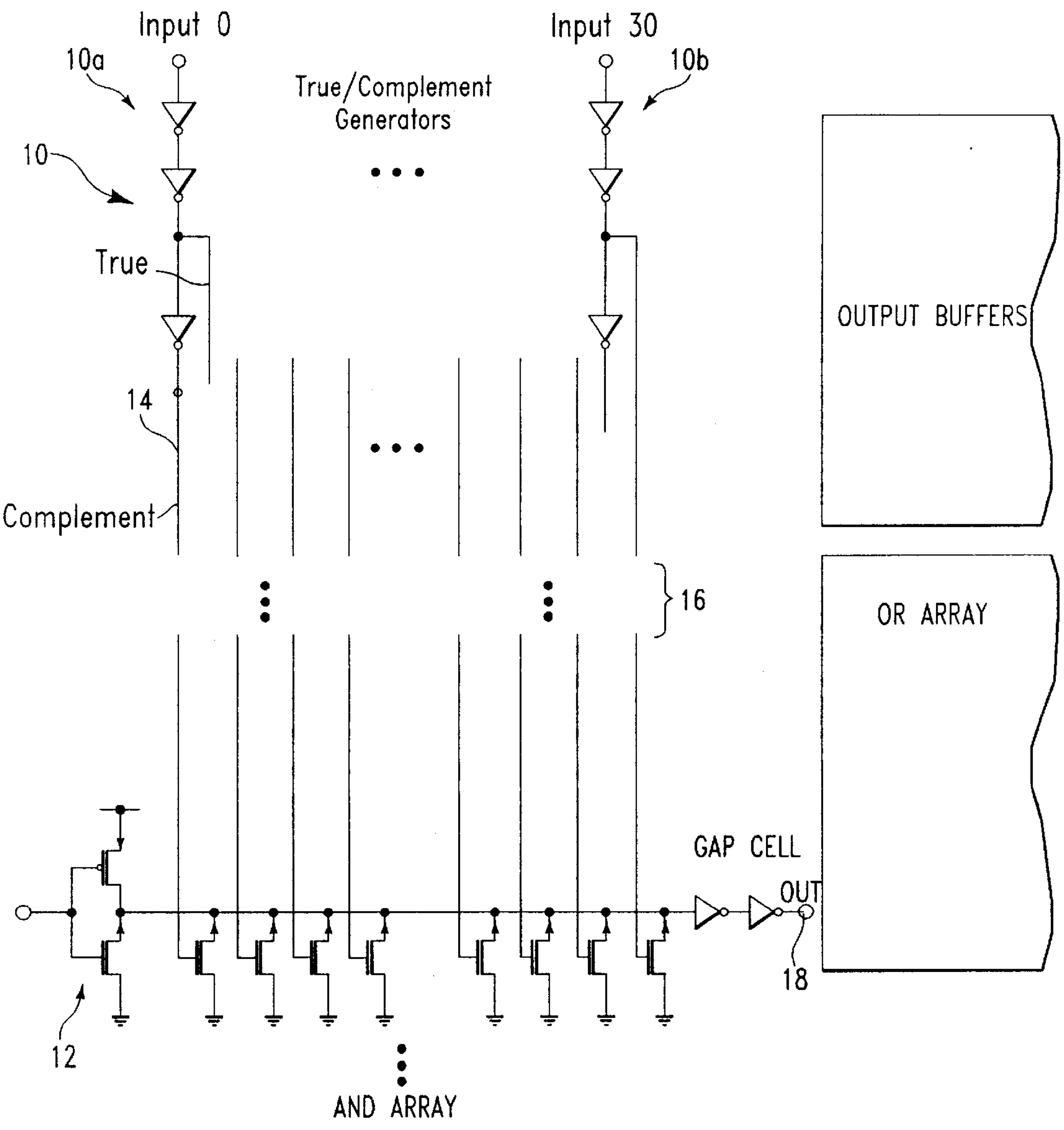
FIG. 1 illustrates a typical PLA structure.
Figure 2:
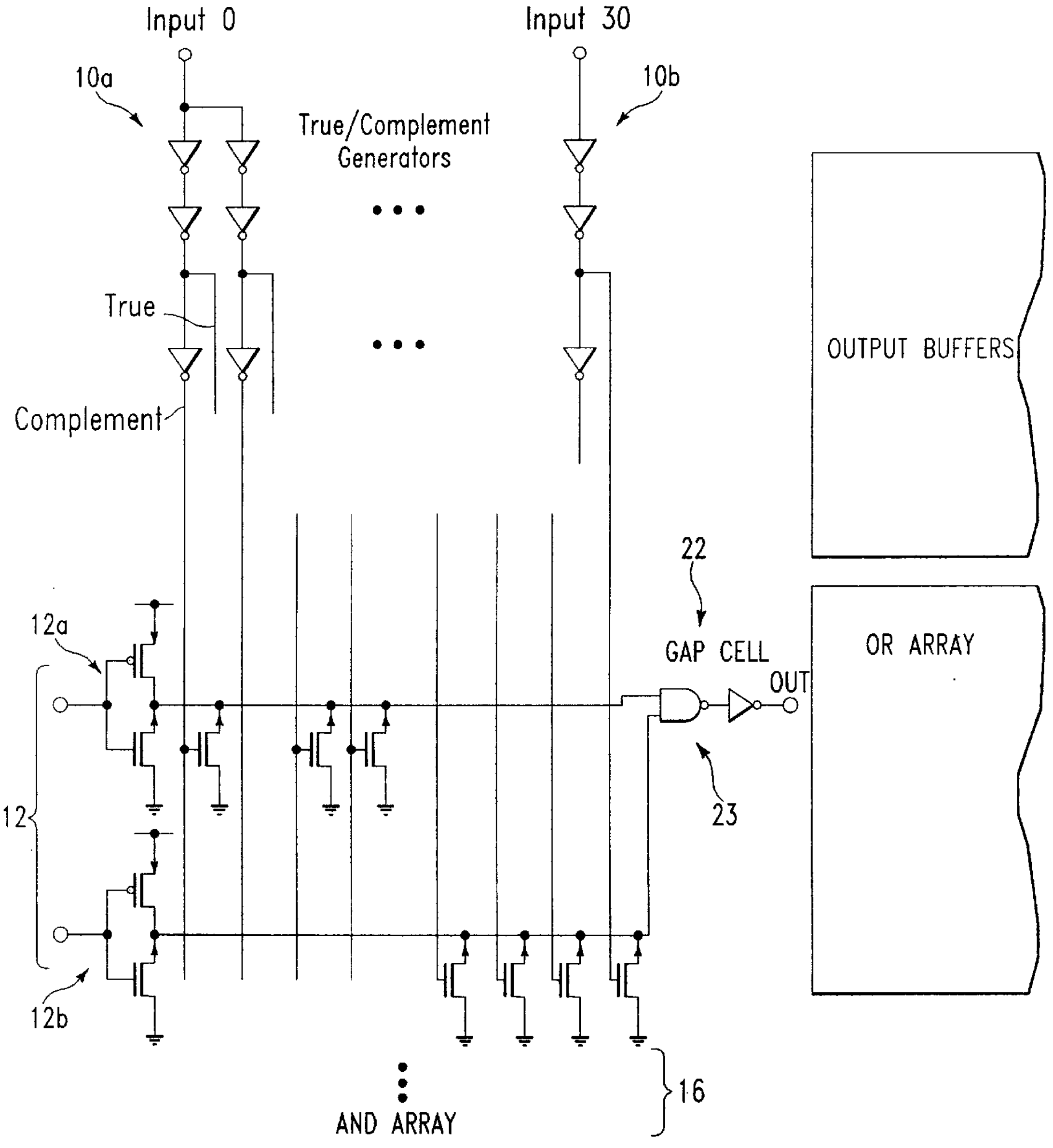
FIG. 2 shows an improved PLA resulting from the inventive three step redesign approach.
Figure 3:
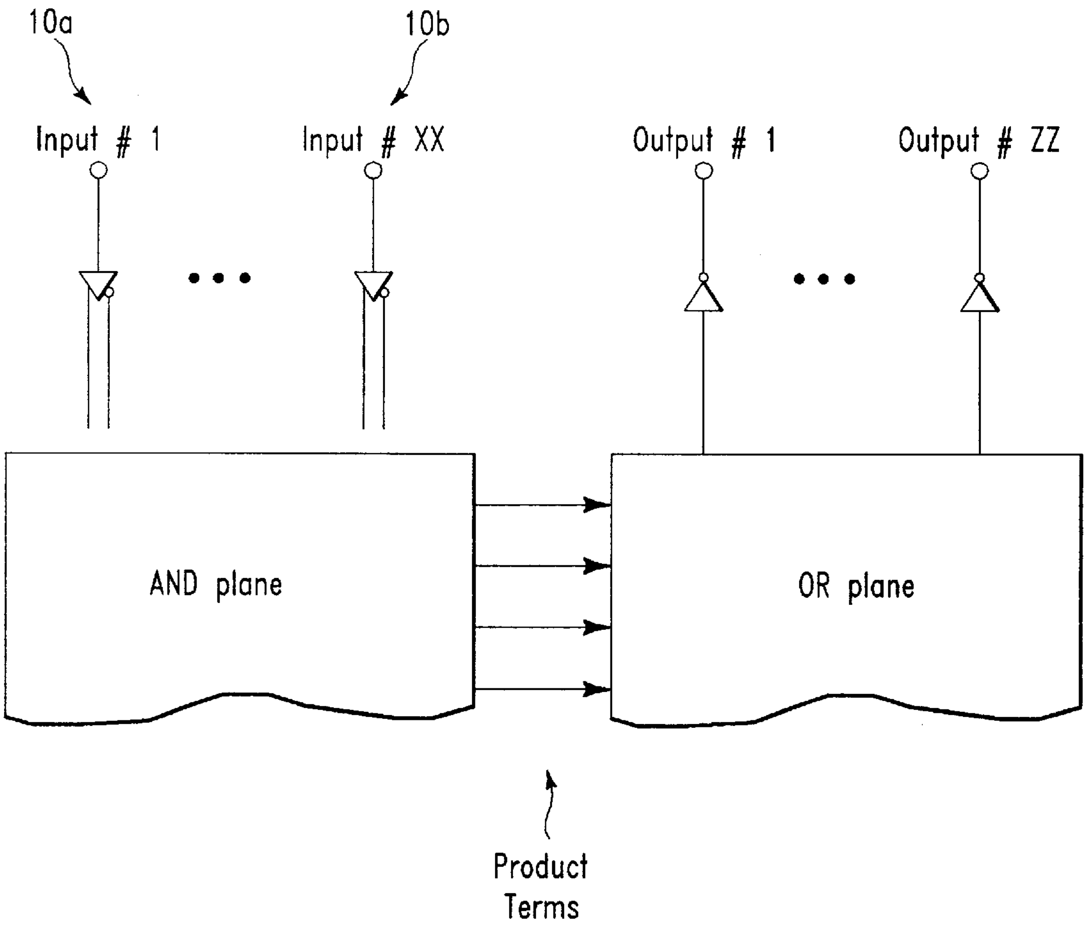
FIG. 3 illustrates an overall view of a PLA system.

Referring to FIGS. 1 and 2, the first step of our three step redesign approach is to move the pre-identified offending product term 12 as close to the input true/complement generators 10 as possible. This will reduce the wiring propagation delay caused by signals traversing a relatively lengthy transmission path 14 (FIG. 1). We can physically move this product term as close to the inputs 10 as possible and, in so doing, push the other product terms 16 further away. Moving a product terms like this does not in any way change the logical operation of the PLA. Element 12 in FIGS. 1 & 2 illustrate the differences in the PLA by this improvement. We have just reduced the wiring delay due to the product term (element 12 of FIG. 1) being far away from the input true/complement generators 10.

The second step in this three step approach involves partitioning the input true/complement generator 10*a* to help distribute the load on this input generator and, thus, to speed up this path. We take the existing input true/complement generator 10*a* that contains our previously identified slow path and we duplicate it 10*a*' (FIG. 2). Although we have increased the input capacitance on this input node 10*a*' and increased the size of the PLA, we have decreased the loading on these generators. FIGS. 1 & 2 show the before and after improvements of this redesign. We have increased the speed of the input true/complement generator 10*a*' by duplicating it and thus distributing its load.

The third step in this three step approach involves partitioning the offending product 12 term so as to distribute the load on it. We take the existing product term 12 and split it into divided but less loaded terms, i.e., sub-terms 12*a* and 12*b* (FIG. 2). These terms now evaluate faster than the original 12 (FIG. 1). We then recombine these signals in the gap cell 22 with a logical function (we show the presently preferred embodiment NAND gate 23 in FIG. 2). FIG. 2 shows the redesign improvements over the conventional PLA of FIG. 1. We have just increased the speed of the product term 12 itself by partitioning it to distribute the load, then recombining it within the gap cell 22. This effectively reduces the propagation delay through the product term.

EXAMPLE

One example is having a PLA with 20 inputs (10*a* thru 10*b* of FIG. 1), 80 Product Terms 16, and any number of outputs 18. If we identify the worst case timing path propagating through the PLA as coming from input 10*a*, which is assumed to be heavily loaded in this example, and passing through the 80th product term (furthest from the inputs in this example), and that product term contained a connection to every input, then we have a propagation delay that can be greatly improved by the present invention.

First, we move the 80th product term from the furthest position away from the true/complement generators and relocate it adjacent to the true/complement generators. Next, we would split input 10*a* into two true/complement generators, instead of the typical one true/complement generator, effectively cutting in half the load seen by the generator at its input. Finally, we would take this 80th product term and split it into two product terms, each containing half of the original number of inputs connected to them. These two new product terms (12*a* and 12*b* of FIG. 2) will now be recombined within the gap cell with a two input NAND gate. By the presently described three step approach we have increased the speed of this example transmission path within the PLA. This approach has decreased the loading on both the input 10*a* true/complement generator and on the product term 12, which also contributes to the speed improvement over this path.

ALTERNATIVE EMBODIMENTS

It will be appreciated that, although specific embodiments of the invention have been described herein for purposes of illustration, various modifications may be made without departing from the spirit and scope of the invention. In particular, one alternative implementation is to use this three step approach on several product terms and on several inputs simultaneously to speed up multiple paths through a PLA simultaneously. A second alternative implementation is to partition the product term itself into more than two sections. A third alternative implementation is to partition the input true/complement generators into more than two sections.

Since other changes may be made in the above structure and method without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims. Accordingly, the scope of protection of this invention is limited only by the following claims and their equivalents.

We claim:

1. A programmable logic array (PLA) comprising:

a plurality of PLA inputs each receiving real PLA input data; and a plurality of true/complement generators coupled in parallel to only one of the PLA inputs for receiving PLA input data arriving at said only one of the PLA inputs, and each generating true and complement data in response thereto.

2. The PLA according to claim 1 wherein the true/complement generators each comprise a plurality of inverters connected in series.

3. The PLA according to claim 1 further comprising:

product terms coupled to the true/complement generators for receiving the true and complement data and partitioned into a plurality of sub-terms, the sub-terms coupled in parallel to a gap cell for transmitting in parallel sub-term data to the gap cell, the gap cell recombining the sub-terms into an output product term.

4. The PLA according to claim 3 wherein the gap cell comprises a logic gate having a plurality of logic inputs for receiving the sub-term data in parallel from the sub-terms.

5. The PLA according to claim 4 wherein the gap cell is coupled to an output array for transmitting the output product term.

6. The PLA according to claim 4 wherein the logic gate is a NAND gate.

7. The PLA according to claim 3 wherein the product term is physically located closer to the true/complement generators than any non-partitioned product term in the PLA.

8. A programmable logic array (PLA) comprising:

a plurality of PLA inputs each receiving real PLA input data;

a plurality of true/complement generators each coupled to at least one of the PLA inputs for generating true and complement data in response to the real PLA input data received at said at least one of the PLA inputs; and a plurality of product terms each coupled to at least one of the true/complement generators for receiving its true and complement data, at least one of the product terms partitioned into a plurality of sub-terms, the sub-terms transmitting sub-term data in parallel to a gap cell for recombining the sub-terms into an output product term.

9. A method of designing a PLA comprising the steps of:

determining by a timing analysis a slow transmission path through the PLA; and after the step of determining, locating a product term corresponding to the slow transmission path nearer to a PLA input than a product term corresponding to a faster transmission path.

10. The method according to claim 9 further comprising the steps of:

partitioning the product term corresponding to the slow transmission path into two sub-term sections; and combining outputs of the two sub-term sections through a gate.

11. The method according to claim 10 further comprising the step of:

splitting a true/complement generator coupled to a PLA input and corresponding to the slow transmission path into two true/complement generators coupled in parallel to the PLA input for receiving simultaneously PLA input signals at the PLA input into the two true/complement generators and each of the two true/complement generators generating true and complement data in response thereto.

* * * * *